(12) United States Patent
Tivadar

(10) Patent No.: US 11,953,274 B2
(45) Date of Patent: Apr. 9, 2024

(54) FLUID HEAT EXCHANGER WITH PUMP

(71) Applicant: Corsair Memory, Inc., Fremont, CA (US)

(72) Inventor: Niko Tivadar, Ljubljana (SI)

(73) Assignee: Corsair Memory, Inc., Milpitas, CA (US)

( * ) Notice: Subject to any disclaimer, the term of this patent is extended or adjusted under 35 U.S.C. 154(b) by 149 days.

(21) Appl. No.: 17/714,968

(22) Filed: Apr. 6, 2022

(65) Prior Publication Data

US 2022/0341431 A1 Oct. 27, 2022

(30) Foreign Application Priority Data

Apr. 23, 2021 (TW) ................. 110114727

(51) Int. Cl.
| | |
|---|---|
| *F28F 3/12* | (2006.01) |
| *F04D 19/02* | (2006.01) |
| *F04D 25/16* | (2006.01) |
| *F04D 29/58* | (2006.01) |
| *F04D 29/70* | (2006.01) |
| *F28D 21/00* | (2006.01) |
| *F28F 3/02* | (2006.01) |
| *H01L 23/473* | (2006.01) |

(52) U.S. Cl.
CPC .............. *F28F 3/12* (2013.01); *F04D 19/024* (2013.01); *F04D 25/166* (2013.01); *F04D 29/582* (2013.01); *F04D 29/703* (2013.01); *F28F 3/02* (2013.01); *H01L 23/473* (2013.01); *F04D 19/022* (2013.01); *F28D 2021/0029* (2013.01); *F28F 2250/08* (2013.01)

(58) Field of Classification Search
CPC . F28F 3/12; F28F 3/02; F28F 2250/08; F04D 19/024; F04D 25/166; F04D 29/582; F04D 29/703; F04D 19/022; F04D 1/00; F04D 13/0606; F04D 29/4293; F04D 29/5866; F04D 29/605; H01L 23/473; F28D 2021/0029; F28D 1/0341
USPC .................................................. 165/185, 122
See application file for complete search history.

(56) References Cited

U.S. PATENT DOCUMENTS

| | | | |
|---|---|---|---|
| 7,753,662 B2 * | 7/2010 | Lai ...................... | F04D 13/0606 417/423.15 |
| 8,051,898 B2 * | 11/2011 | Chiang ................. | H01L 23/473 417/313 |
| 10,299,406 B2 * | 5/2019 | Lin ..................... | H05K 7/20409 |

(Continued)

*Primary Examiner* — Len Tran
*Assistant Examiner* — Gustavo A Hincapie Serna
(74) *Attorney, Agent, or Firm* — Carina M. Tan; Corsair Memory, Inc.

(57) ABSTRACT

A fluid heat exchanger with pump, adapted to drive a fluid for heat transfer, comprises a heat conduction unit, a diversion unit, and a housing unit. The heat conduction unit includes a heat conductor. The diversion unit includes a cover and a diversion plate. A cooling chamber is defined by the cover and the heat conductor. The cover is provided with a fluid stopper. The diversion plate is disposed in the cooling chamber, and one end of the diversion plate abuts against the fluid stopper, so that the cooling chamber is divided into an upper passage and a lower passage. The housing unit includes a housing and a pump module. The fluid in the housing is driven by the pump module to flow through the upper passage to the lower passage, and then the fluid returns to the housing to carry the heat from the heat conductor.

8 Claims, 8 Drawing Sheets

(56) References Cited

U.S. PATENT DOCUMENTS

| | | | |
|---|---|---|---|
| 2005/0276703 A1* | 12/2005 | Lee | F04D 13/0666 417/423.7 |
| 2006/0171801 A1* | 8/2006 | Manabe | H01L 23/473 415/176 |
| 2006/0185829 A1* | 8/2006 | Duan | H01L 23/473 257/E23.098 |
| 2009/0159244 A1* | 6/2009 | Mounioloux | G06F 1/20 165/104.33 |
| 2014/0334921 A1* | 11/2014 | Park | F04D 29/586 415/175 |
| 2016/0363967 A1* | 12/2016 | Tsai | H05K 7/20272 |
| 2017/0192471 A1* | 7/2017 | Tsai | H01L 23/473 |
| 2017/0235350 A1* | 8/2017 | Tsai | G06F 1/20 165/80.4 |
| 2017/0339802 A1* | 11/2017 | Pan | F28D 15/00 |
| 2019/0208665 A1* | 7/2019 | Tsai | H05K 7/20254 |
| 2019/0317577 A1* | 10/2019 | Lin | G06F 1/206 |
| 2020/0053911 A1* | 2/2020 | Han | H05K 7/20263 |
| 2020/0173728 A1* | 6/2020 | Pan | G06F 1/20 |
| 2020/0340767 A1* | 10/2020 | Holden | G01M 3/16 |
| 2020/0344912 A1* | 10/2020 | Lai | H05K 7/20272 |
| 2020/0396866 A1* | 12/2020 | Chen | H05K 7/20509 |
| 2021/0015001 A1* | 1/2021 | Xiao | H05K 7/20272 |
| 2021/0199391 A1* | 7/2021 | Xiao | F04D 29/606 |
| 2021/0307197 A1* | 9/2021 | Chen | H05K 7/20772 |
| 2022/0065267 A1* | 3/2022 | Tsai | F04D 29/5806 |
| 2022/0074429 A1* | 3/2022 | Fan | F04D 13/0673 |
| 2023/0164947 A1* | 5/2023 | Andre | H05K 7/20272 361/702 |
| 2023/0194005 A1* | 6/2023 | Jensen | F16K 11/074 415/148 |
| 2023/0304499 A1* | 9/2023 | Zhang | H01M 10/6556 |

\* cited by examiner

FLUID HEAT EXCHANGER WITH PUMP

CROSS REFERENCE TO RELATED APPLICATIONS

This application claims the benefit of priority to Taiwanese patent application no. TW110114727 filed Apr. 23, 2021 entitled "Fluid Heat Exchanger with Pump", the contents of which are incorporated herein by reference in their entirety for all purposes.

TECHNICAL FIELD

The present invention relates to a fluid heat exchanger, more particularly relates to a fluid heat exchanger with pump.

DESCRIPTION OF THE PRIOR ART

A computer is composed of many semiconductor chips to calculate electronic signals, and the semiconductor chip generates heat during operation. When the heat accumulates too much and cannot be conducted to the outside, excessive temperature will occur and cause damage to the semiconductor chips.

In the early days, the composition of electronic components in semiconductors was less dense and generated less heat. Therefore, passive cooling technique like heat sinks is sufficient enough to conduct heat generated by semiconductors to the outside.

However, with the advancement of semiconductor technology, more transistors can be installed per unit volume in a semiconductor chip, so the semiconductor chip will generate more heat. Therefore, an active radiator is required to effectively conduct the heat generated by the semiconductor chip to the outside.

Refer to FIG. 1, a Taiwanese Patent No. 202006305A, which relates to a water bulk 1. The water bulk 1 comprises a housing 11, an inlet 12 provided in the housing 11, and an outlet 13 provided in the housing 11, a vane 14 arranged inside the housing 11, a heat conductor 15 arranged inside the housing 11, and a shaft 16 arranged inside the housing 11.

The rotation direction of the vane 14 is parallel to the setting direction of the heat conductor 15. The inlet 12 is arranged on the lateral side of the heat conductor 15. A fluid flows from the lateral side of the heat conductor 15 to the center of the heat conductor 15, and is pushed to the outlet 13 by the rotating centrifugal force of the vane 14.

Although the prior art discloses a water bulk, it still has the following disadvantages in actual implementation:

1. Slow Flow Speed

When the vane rotates, the center of the vane will generate suction to pull the fluid at the heat conductor, and then the fluid is driven out by centrifugal force. Generally, under the same power condition, the suction for pulling the fluid has less energy and lower flow speed than the pushing motion.

2. Heat Accumulation

Since, the fluid flows from the periphery of the heat conductor to the center of the heat conductor, the center of the heat conductor will have higher temperature. Therefore, the heat will accumulate in the center of the semiconductor chip and cannot be effectively conducted to the outside.

3. Mechanical Malfunctions

The shaft is inserted in the housing, and the rotor is set in the fluid. The magnet of the rotor is set inside the housing, and the whole rotor rotates in the fluid. Small particles in the fluid will accumulate and wear the rotor, so that mechanical malfunctions will occur easily in a rotor with blades.

Therefore, it is desirable to have a heat transfer method that effectively diverts the fluid and effectively conducts the heat generated by the semiconductor to the outside.

BRIEF DESCRIPTION OF THE DRAWINGS

For a better understanding of the aforementioned aspects of the invention as well as additional aspects and embodiments thereof, reference should be made to the Description of Embodiments below, in conjunction with the following drawings in which like reference numerals refer to corresponding parts throughout the figures.

DESCRIPTION OF EMBODIMENTS

Methods, systems, user interfaces, and other aspects of the invention are described. Reference will be made to certain embodiments of the invention, examples of which are illustrated in the accompanying drawings. While the invention will be described in conjunction with the embodiments, it will be understood that it is not intended to limit the invention to these particular embodiments alone. On the contrary, the invention is intended to cover alternatives, modifications and equivalents that are within the spirit and scope of the invention. The specification and drawings are, accordingly, to be regarded in an illustrative rather than a restrictive sense.

Moreover, in the following description, numerous specific details are set forth to provide a thorough understanding of the present invention. However, it will be apparent to one of ordinary skill in the art that the invention may be practiced without these particular details. In other instances, methods, procedures, components, and networks that are well known to those of ordinary skill in the art are not described in detail to avoid obscuring aspects of the present invention.

Figure 1:
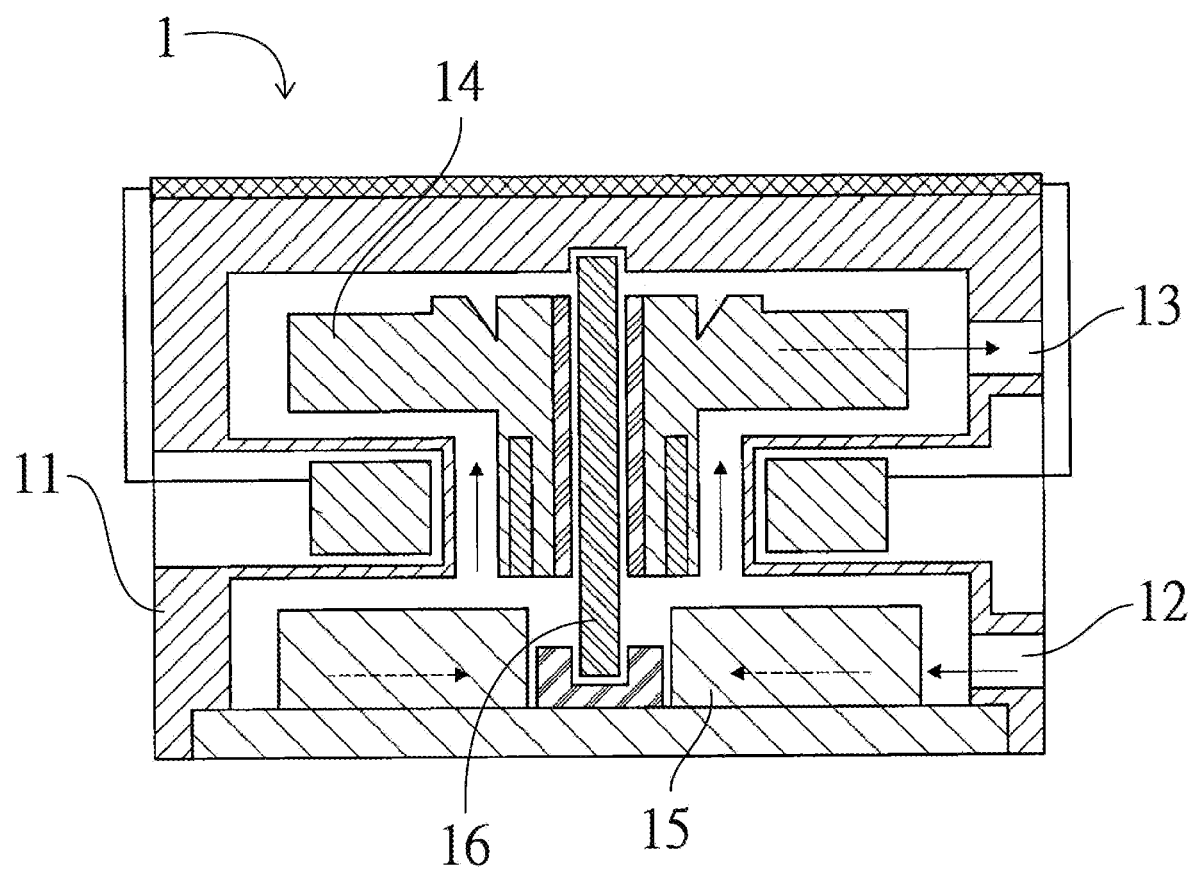
FIG. 1 is a schematic cross-sectional view showing a water bulk of the Taiwanese Patent No. 202006305A.
Figure 2:
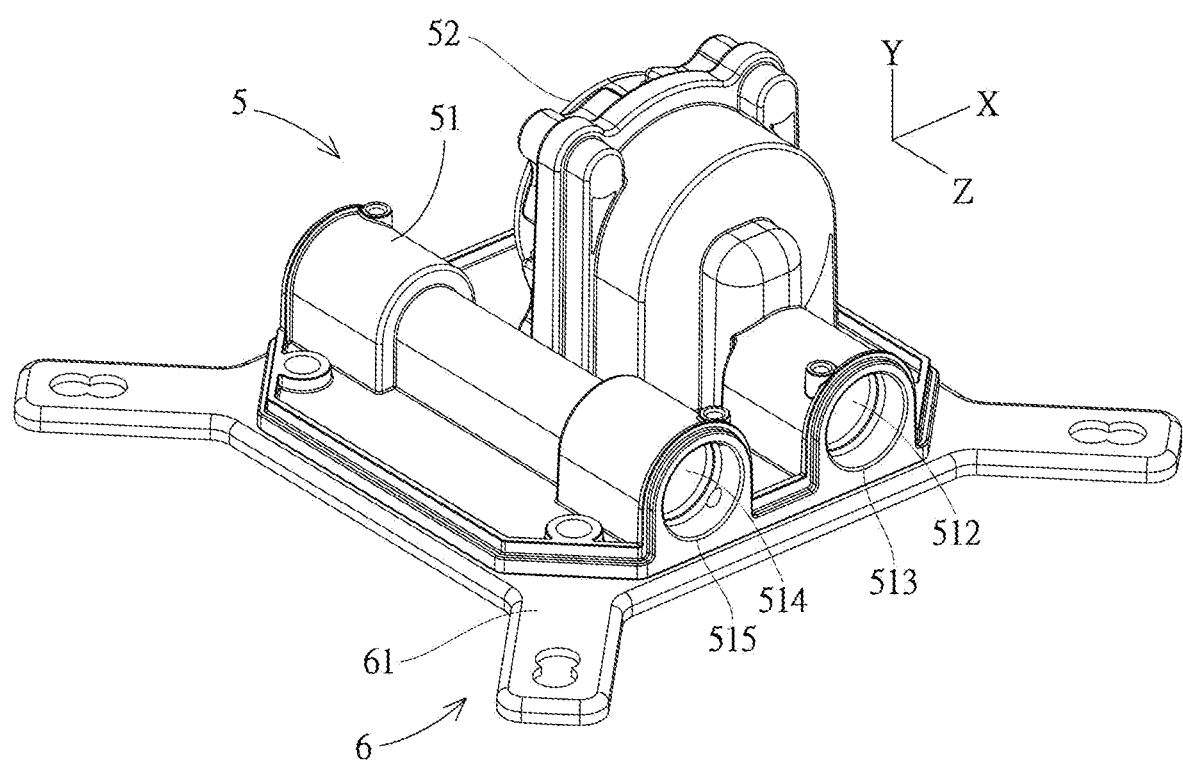
FIG. 2 is a schematic structural diagram showing a fluid heat exchanger with pump according to an embodiment of the present invention.
Figure 3:
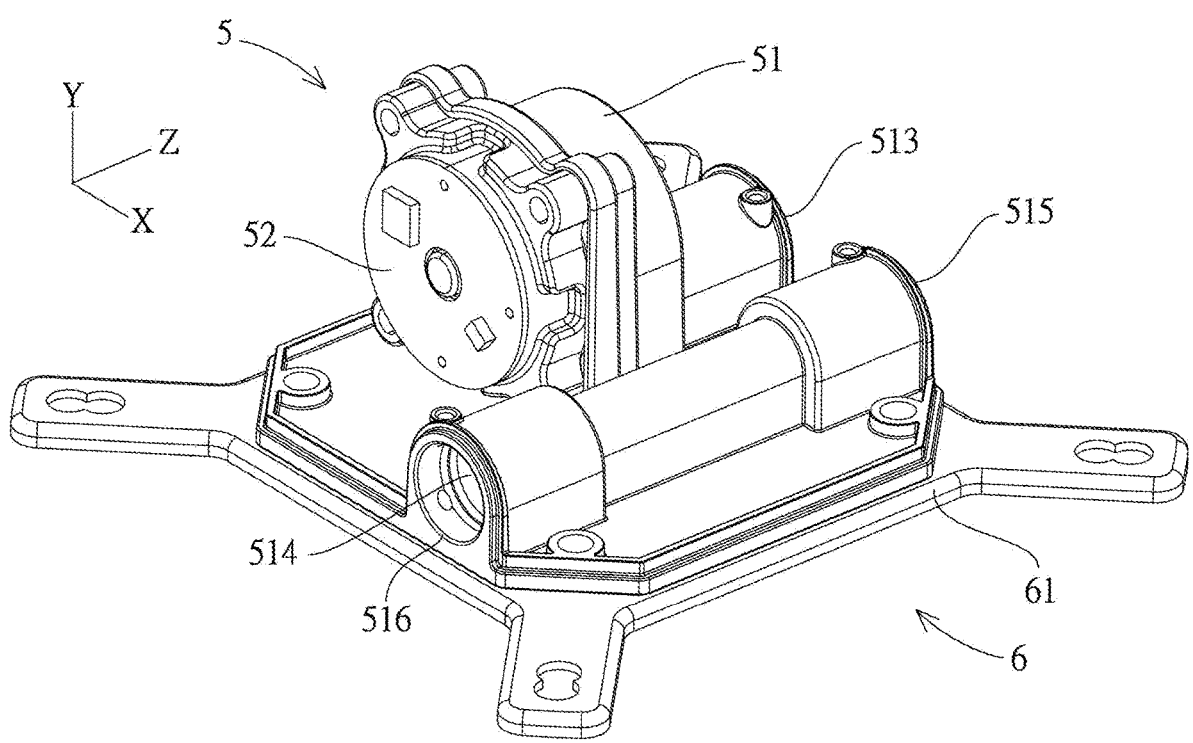
FIG. 3 is a schematic structural diagram showing the fluid heat exchanger according to an embodiment of the present invention.
Figure 7:
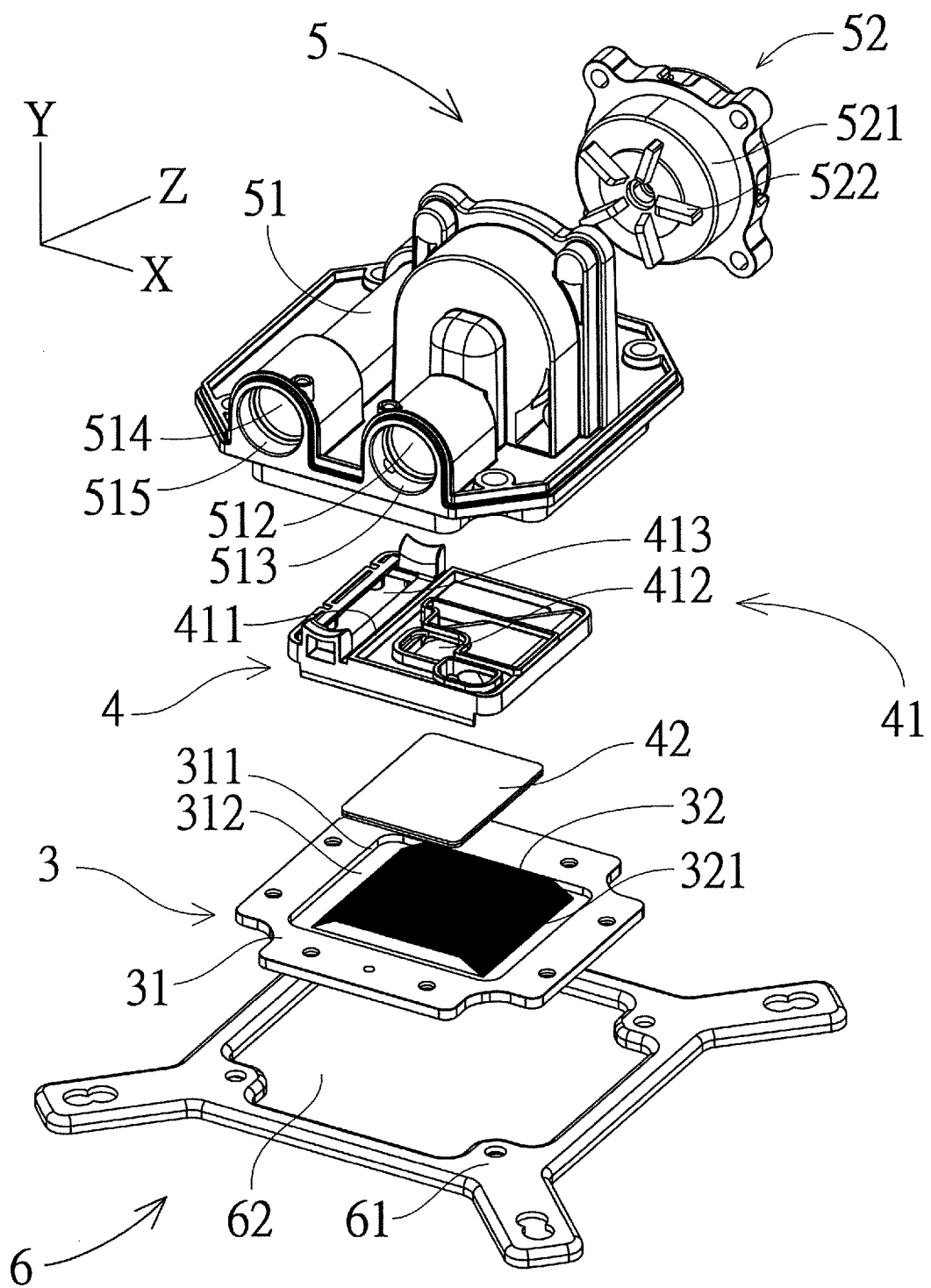
FIG. 7 is a schematic exploded view showing the fluid heat exchanger according to an embodiment of the present invention.

Refer to FIGS. 2, 3 and 7, an embodiment of a fluid heat exchanger with pump. The fluid heat exchanger with pump, adapted to drive a fluid for heat transfer, comprises a heat conduction unit 3, a diversion unit 4, a housing unit 5, and a mounting unit 6.

Figure 4:
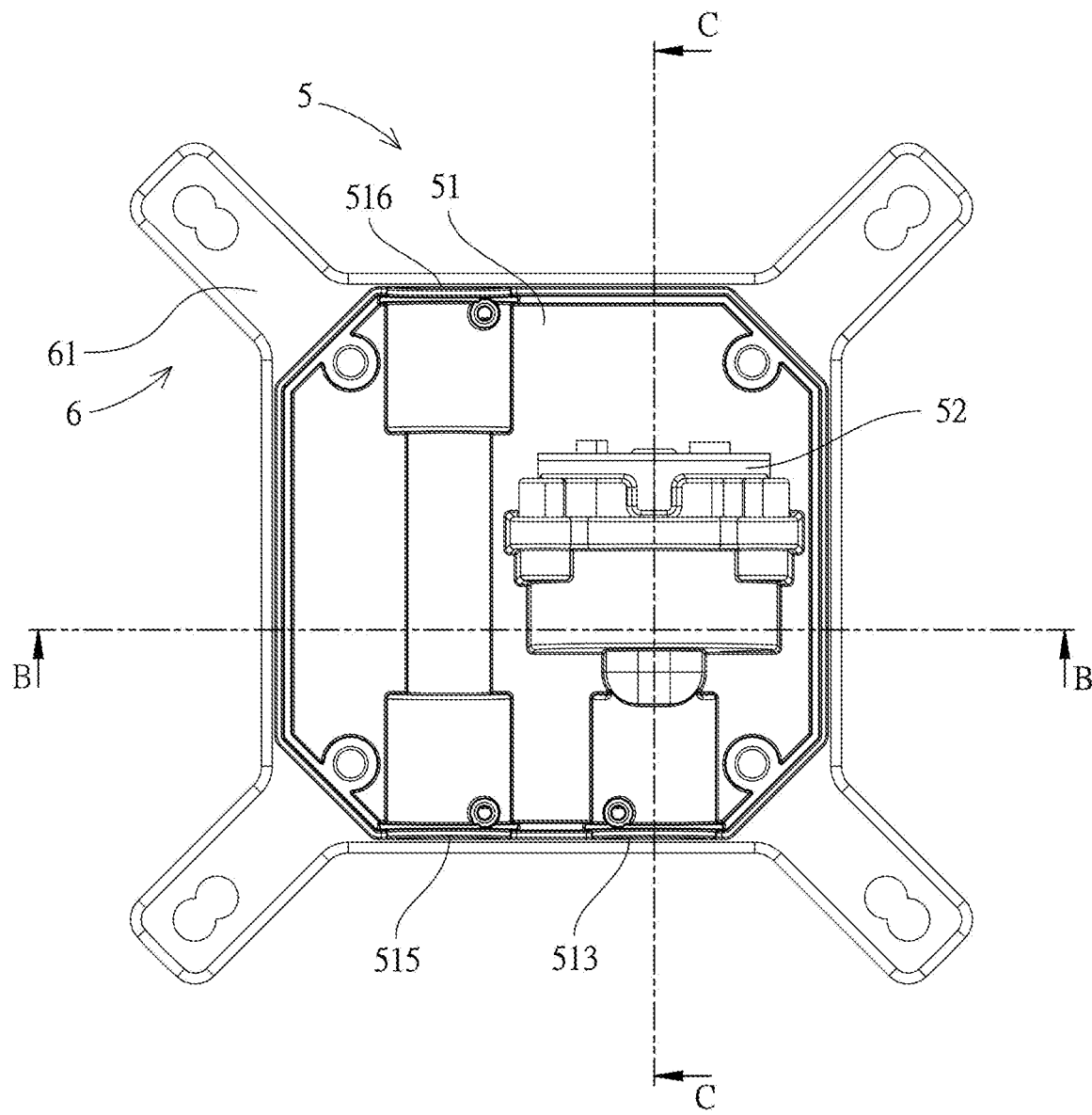
FIG. 4 is a top view showing the fluid heat exchanger according to an embodiment of the present invention.
Figure 5:
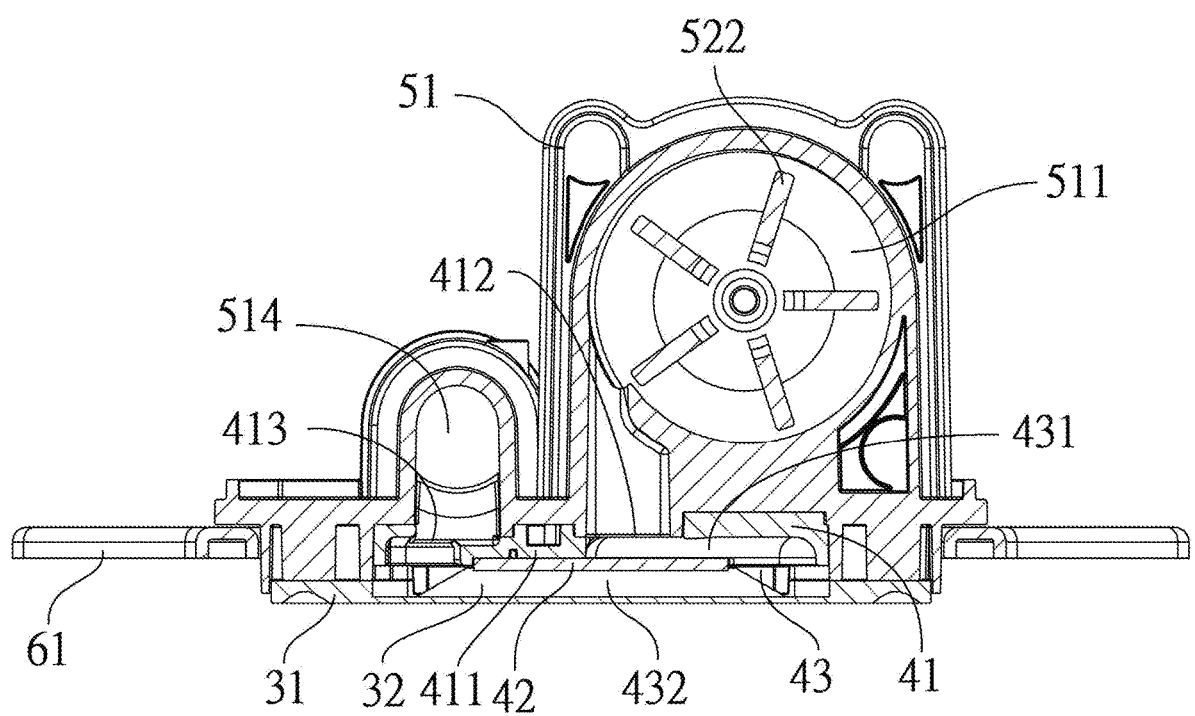
FIG. 5 is a schematic cross-sectional view taken along line B-B in FIG. 4 showing the fluid heat exchanger according to an embodiment of the present invention.
Figure 6:
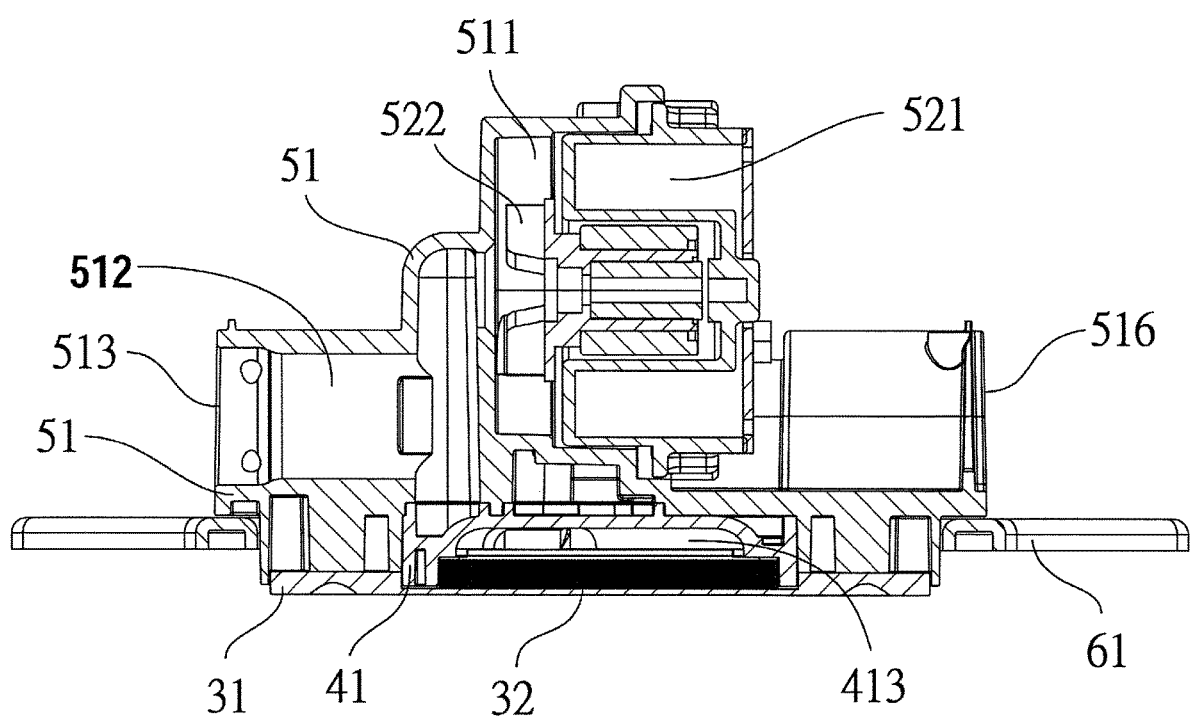
FIG. 6 is a schematic cross-sectional view taken along line C-C in FIG. 4 showing the fluid heat exchanger according to an embodiment of the present invention.

Refer to FIGS. 4, 5 and 6, FIG. 4 is a top view showing the fluid heat exchanger according to an embodiment of the present invention, and a line B-B and a line C-C are illustrated in FIG. 4. FIG. 5 is a schematic cross-sectional view taken along line B-B in FIG. 4, and FIG. 6 is a schematic cross-sectional view taken along line C-C in FIG. 4.

Figure 8:
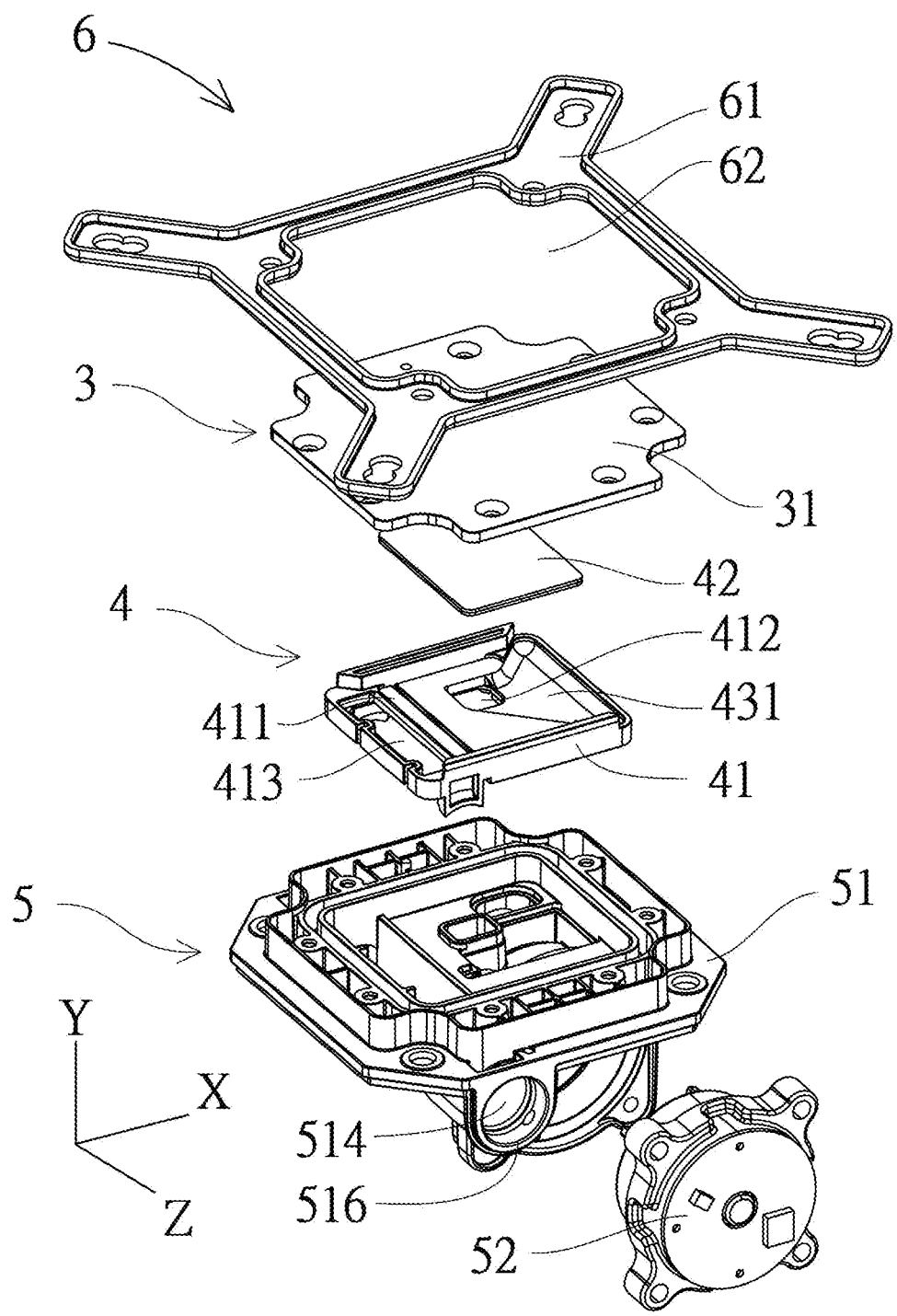
FIG. 8 is a schematic exploded view showing the fluid heat exchanger according to an embodiment of the present invention.

Refer to FIGS. 7 and 8, the heat conduction unit 3 includes a heat conductor 31 and a fin array 32.

The lower surface of the heat conductor 31 can be in contact with a semiconductor wafer (not shown) to conduct the heat of the semiconductor wafer. The upper surface of the heat conductor 31 is provided with a surrounding wall 311, and a bottom wall 312 connected to the bottom of the surrounding wall 311. The surrounding wall 311 and the bottom wall 312 form an indention on the upper surface of the heat conductor 31. The fin array 32 is disposed in the indention, and the bottom of the fin array 32 is in contact with the bottom wall 312.

Refer to FIG. 5, the diversion unit 4 (see FIG. 7) includes a cover 41 disposed on the heat conductor 3 (see FIG. 7) and a diversion plate 42. A cooling chamber 43 is defined by the cover 41 and the heat conductor 31.

The cover 41 is provided with a fluid stopper 411. The diversion plate 42 is disposed in the cooling chamber 43, and one end of the diversion plate 42 abuts against the fluid stopper 411, so that the cooling chamber 43 is divided into an upper passage 431 and a lower passage 432. The fluid stopper 411 is configured to separate the fluid that enters the lower passage 432 and flows out of the lower passage 432.

The cover 41 is provided with an inlet 412 and an outlet 413. The inlet 412 is connected to the upper passage 431, and the outlet 413 is connected to the lower passage 432. The fluid stopper 411 separates the inlet 412 and the outlet 413.

Refer to FIG. 7, the housing unit 5 includes a housing 51 covering the cover 41 and a pump module 52 disposed on the driving chamber 511 (see FIG. 5) matches the rotation space of the upright impeller 522, so that the upright impeller 522 is driven by the motor 521 to rotate in the driving chamber 511, and the fluid in the driving chamber 511 is also driven to flow.

The housing 51 is provided with a first channel 512 connected to the driving chamber 511, a first connector port 513 connected to the first channel 512 for loading the fluid, a second channel 514 connected to the lower passage 432 (see FIG. 5), a second connector port 515 connected to the second channel 514 for discharging the fluid, and a third connector port 516 (see FIG. 3 and FIG. 6) connected to the second channel 514.

The driving chamber 511 is connected to the inlet 412, and the outlet 413 is connected to the second channel 514. When the fluid in the housing 51 is driven by the pump module 52, the fluid will enter the first channel 512, the driving chamber 511, the inlet 412, the upper passage 431, the lower passage 432, the outlet 413, and the second channel 514 in sequence from the first connector port 513. Then, the fluid will flow out through the second connector port 515 and the third connector port 516. According to certain embodiments of the invention, the third connector port 516 can allow the fluid to flow into the second channel 514, and all the fluid will flow out from the second connector port 515, or according to the design of the external pipeline, the second connector port 515 or the third connector port 516 can be served as an outlet for the fluid, which do not limit the scope of the invention.

Refer to FIG. 5, the fin array 32 is disposed on the bottom wall 312 (see FIG. 7), and the bottom surface of the diversion plate 42 abuts against the top surface of the fin array 32. The fin array 32 is composed of a plurality of heat sink fins. The height of the plurality of heat sink fins matches the height of the lower passage 432. After the fluid flows from the upper passage 431 into the lower passage 432, the fluid flows from the right side of the plurality of heat sink fins to the left side of the plurality of heat sink fins. In such way, the fluid fully contacts the plurality of heat sink fins and carries the heat from the plurality of heat sink fins. In addition, the heat of the semiconductor chip is conducted by the heat conductor 31, and the heat of the heat conductor 31 is conducted by the plurality of heat sink fins, so that a heat dissipation effect can be achieved.

The front and back ends of the fin array 32 are provided with a respective inclined portion 321, so that the plurality of heat sink fins form a pattern with two lower ends and a higher middle. One of the inclined portions 321 is located below the junction of the upper passage 431 and the lower passage 432, and the space above the inclined portion 321 allows the fluid entering the lower passage 432 from the upper passage 431 to be evenly spread out and flow into the gaps between the plurality of heat sink fins. The other inclined portion 321 is located below the outlet 413, and the space above the inclined portion 321 allows the fluid flowing out of the plurality of gaps to accumulate, and then flow into the second channel 514 through the outlet 413.

Refer to FIGS. 2, 3, 7 and 8, the direction of the diversion plate 42 defines an XZ plane, and the rotation direction of the upright impeller 522 defines an XY plane. The XZ plane and the XY plane are perpendicular to each other.

The upright impeller 522 rotates along the Z axis, and the rotating force of the upright impeller 522 can push the fluid to flow through the inlet 412 and directly contact the upper surface of the diversion plate 42. Since the upper passage 431 has a fan shape (please see FIG. 8), the fluid directly contacting the upper surface of the diversion plate 42 can be guided to evenly enter one side of the lower passage 432.

Refer to FIGS. 5, 6, 7 and 8, the mounting unit 6 includes a bracket 61 connected to the housing 51, and a mounting hole 62 provided on the bracket 61. In an embodiment, there is a convex structure below the housing 51 that matches the shape of the mounting hole 62, so that the bottom of the housing 51 can pass through the mounting hole 62. In actual implementation, the housing 51 may not pass through the mounting hole 62, which do not limit the scope of the invention.

The bracket 61 and the housing 51 are fastened together, the heat conductor 31 is fixed to the bottom of the housing 51, and the bracket 61 can be fastened together with a circuit board (not shown). In such way, the heat conductor 31 is in contact with the semiconductor wafer to carry the heat from the semiconductor wafer.

It can be understood from the above description that the present fluid heat exchanger with pump has the following features:

1. Faster Flow Speed

The upright impeller 522 rotates along the Z axis, and the diversion plate 42 is arranged on the XZ plane. When the upright impeller 522 rotates, the fluid is pushed out by centrifugal force, so that the fluid can directly contact the diversion plate 42 and flow from the upper passage 431 to the lower passage 432. Compared with the conventional method of pulling the fluid from the accommodating space, the pressure of the fluid can be increased via the way of directly contacting the diversion plate 42 in the present invention, so that the flow speed can also be increased.

2. Better Heat Dissipation

The two inclined portions 321 arranged on the opposite sides of the fin array 32 can allow the fluid to evenly pass through the gaps between the plurality of heat sink fins, and allow the fluid to flow from one end of the fin array 32 to the other end of the fin array 32. In such way, the heat of the heat conductor 31 is effectively removed, and a better heat dissipation effect can be obtained.

3. Better Durability

The motor 521 of the pump module 52 is fixed to the housing 51, and the fluid will not be in direct contact with the motor 521. Neither the shaft that rotates the upright impeller 522 is fixed in the housing 51, so that the fluid will not damage the motor 521 and drive the shaft of the upright impeller 522, and the pump module 52 can have better durability.

In conclusion, the rotation direction of the upright impeller 522 and the setting direction of the diversion plate 42 are perpendicular to each other, so that the fluid driven by the centrifugal force of the upright impeller 522 can directly contact the diversion plate 42. In such way, the hydrodynamic losses can be effectively reduced. When the fluid in the lower passage 432 flows from one end of the fin array 32 to the other end, the heat in the center of the heat conductor 31 is effectively removed, and the heat accumulation will not occur on the heat conductor 31. Therefore, the heat dissipation effect can be effectively improved.

I claim:

1. A fluid heat exchanger with pump, adapted to drive a fluid for heat transfer, comprising:
   a heat conduction unit (3), including a heat conductor (31);
   a diversion unit (4), including a cover (41) arranged on the heat conductor (31) and a diversion plate (42), wherein a cooling chamber (43) is defined by the cover (41) and the heat conductor (31), the cover (41) is provided with a fluid stopper (411), the diversion plate (42) is disposed in the cooling chamber (43), and one end of the diversion plate (42) abuts against the fluid stopper (411), so that the cooling chamber (43) is divided into an upper passage (431) and a lower passage (432); and
   a housing unit (5), including a housing (51) covering the cover (41) and accommodating the fluid, and a pump module (52) disposed in the housing (51), wherein the pump module (52) has a motor (521) arranged in the housing (51), and an upright impeller (522) connected to the motor (521), the housing (51) has a driving chamber (511) for accommodating the upright impeller (522), and the upright impeller (522) is driven by the motor (521) to rotate in the driving chamber (511), the fluid in the housing (51) is driven by the pump module (52) to flow through the upper passage (431) to the lower passage (432), and then the fluid returns to the housing (51) to carry the heat from the heat conductor (31);
   wherein the diversion plate (42) defines an XZ plane, the rotation direction of the upright impeller (522) defines a XY plane, and the XZ plane and the XY plane are perpendicular to each other.

2. The fluid heat exchanger with pump as claimed in claim 1, wherein the housing (51) is provided with a first channel (512) connected to the driving chamber (511), and a first connector port (513) connected to the first channel (512) for loading the fluid.

3. The fluid heat exchanger with pump as claimed in claim 1, wherein the housing is provided with a second channel (514) connected to the lower passage (432), a second connector port (514) connected to the second channel (514) for discharging the fluid, and a third connector port (516) connected to the second channel (514).

4. The fluid heat exchanger with pump as claimed in claim 1, wherein the heat conductor (31) is provided with a surrounding wall (311), and a bottom wall connected (312) to the surrounding wall (311).

5. The fluid heat exchanger with pump as claimed in claim 1, wherein the heat conduction unit (3) further includes a fin array (32) located on the bottom wall (311) and disposed in the lower passage (432).

6. The fluid heat exchanger with pump as claimed in claim 5, wherein the fin array (32) is composed of a plurality of heat sink fins, and front and back ends of the fin array (32) are provided with a respective inclined portion (321), so that the plurality of heat sink fins form a pattern with two lower ends and a higher middle.

7. The fluid heat exchanger with pump as claimed in claim 1, wherein the cover (41) is provided with an inlet (412) and an outlet (413), the inlet (412) is connected to the upper passage (431), and the outlet (413) is connected to the lower passage (432).

8. The fluid heat exchanger with pump as claimed in claim 1, further comprises a mounting unit (6), which includes a bracket (61) connected to the housing (51), and a mounting hole (62) provided on the bracket (61).

* * * * *